(12) United States Patent
Cheng et al.

(10) Patent No.: US 7,381,941 B2
(45) Date of Patent: *Jun. 3, 2008

(54) CONTACT IMAGE SENSING MODULE WITH MOVEMENT DETECTING FUNCTION

(75) Inventors: Chia-Chu Cheng, Taipei (TW); Ming-Ho Wang, Taipei (TW)

(73) Assignee: Lite-On Semiconductor Corp., Taipei (TW)

( * ) Notice: Subject to any disclaimer, the term of this patent is extended or adjusted under 35 U.S.C. 154(b) by 270 days.

This patent is subject to a terminal disclaimer.

(21) Appl. No.: 11/260,121

(22) Filed: Oct. 28, 2005

(65) Prior Publication Data

US 2006/0140459 A1    Jun. 29, 2006

(30) Foreign Application Priority Data

Dec. 24, 2004   (TW) .............................. 93220921 U

(51) Int. Cl.
*H01L 27/00*   (2006.01)
*G06K 9/00*    (2006.01)

(52) U.S. Cl. ..................... 250/221; 250/208.1; 356/71; 382/124

(58) Field of Classification Search ............. 250/208.1, 250/221; 382/124–127; 356/71
See application file for complete search history.

(56) References Cited

U.S. PATENT DOCUMENTS

| | | | |
|---|---|---|---|
| 5,621,516 A * | 4/1997 | Shinzaki et al. ............... | 356/71 |
| 6,011,860 A * | 1/2000 | Fujieda et al. ............... | 382/126 |
| 6,259,108 B1 * | 7/2001 | Antonelli et al. ............ | 250/556 |
| 6,324,310 B1 | 11/2001 | Brownlee | |
| 6,355,937 B2 * | 3/2002 | Antonelli et al. ............ | 250/556 |
| 6,627,871 B2 * | 9/2003 | Iwamoto et al. ............ | 250/221 |
| 6,628,813 B2 * | 9/2003 | Scott et al. .................. | 382/124 |
| 7,054,471 B2 * | 5/2006 | Tschudi ....................... | 382/124 |
| 7,103,201 B2 * | 9/2006 | Scott et al. .................. | 382/124 |
| 7,110,577 B1 * | 9/2006 | Tschudi ....................... | 382/124 |
| 2004/0208346 A1 * | 10/2004 | Baharav et al. ............. | 382/124 |
| 2004/0208347 A1 * | 10/2004 | Baharav et al. ............. | 382/124 |
| 2004/0208348 A1 * | 10/2004 | Baharav et al. ............. | 382/124 |

FOREIGN PATENT DOCUMENTS

TW            544630         8/2003

* cited by examiner

*Primary Examiner*—Davienne Monbleau
(74) *Attorney, Agent, or Firm*—Rosenberg, Klein & Lee

(57) ABSTRACT

A contact image sensing module with movement detecting function has a main circuit substrate, a linear sensor array, at least a movement detecting element, a light source, a light-guiding device, and a detecting surface. The main substrate is a flex-rigid composite substrate having a structure making the linear sensor array have a tilted angle. The linear sensor array has at least a comparison sensor corresponding to at least a movement detecting element. The movement detecting element and the comparison sensor, respectively, draw a section of reference image data and a section of comparison image data from a sensed object. After processing a shift-times deciding equation and a speed deciding equation, the moving speed of the sensed object relating to the movement detecting element and the comparison sensor can be obtained. The structure of the light-guiding device makes the light from the light source to the sensed object more uniform.

18 Claims, 8 Drawing Sheets

CONTACT IMAGE SENSING MODULE WITH MOVEMENT DETECTING FUNCTION

BACKGROUND OF THE INVENTION

1. Field of the Invention

The present invention is related to an image sensing module, and more particularly to a contact image sensing module with a movement detecting function.

2. Description of Related Art

An image sensing module uses an optical technique to draw an image of a sensed object. For example, an image sensing module with a fingerprint scanning function is used to draw a planar image. The image sensing module must therefore be able to detect a moving speed of the fingerprint on the module to obtain fragmental fingerprint images. A complete fingerprint image can thus be integrated by means of operation processing.

A conventional image sending module with a movement detecting function, such as "Method and apparatus for scanning a fingerprint using a linear sensing" disclosed in TW 544630 published on Aug. 1, 2003, includes a linear image device, a roller, a light source, a focusing device, and rotatable detector. The roller is used to provide a fingerprint to be moved thereon. The light from the light source is transmitted to the roller, reflected by the fingerprint to the focusing device and focused on the linear image device. The rotatable detector is used to detect the rotation speed of the roller for obtaining the moving speed of the fingerprint.

The above conventional image sensing module with a movement detecting function needs the roller and the rotatable detector to decide the moving speed of the fingerprint. As a result, the whole image sensing module is large and complex in structure. It is not suitable for assembly on a microminiaturized electronic apparatus.

Moreover, for accurately transmitting the light to the linear image device, the position of the focusing device cannot have any deviation. Therefore, the small tolerance may lead to a high quality assembling demand so as to influence the product yield.

Furthermore, the non-uniform light magnitude transmitted from the light source to the roller may result in a complex operation processing of the drawn fingerprint image by the conventional image sensing module and therefore a low efficiency.

In addition, if the number of light sources, which are alternatingly arranged under the roller, is increased, the problem of a non-uniform light magnitude may still exist, and the cost and the power consumption may also be increased as well.

SUMMARY OF THE INVENTION

The main object of the present invention is to provide a contact image sensing module with a movement detecting function, in which, due to the architecture of the sensors, a moving speed of a sensed object relative to the sensors can be detected so that the volume thereof can be reduced and the space occupied by the assembled electronic apparatus can be conserved.

Another object of the present invention is to provide a contact image sensing module with a movement detecting function whose light path formed by the light from the light source to its sensors allows a larger tolerance so that the product yield can be improved.

A further object of the present invention is to provide a contact image sensing module with a movement detecting function, which makes the light transmitted from the light source to a sensed object more uniform. The processing of the drawn image of the sensed object can then be more efficient.

A further another object of the present invention is to provide a contact image sensing module with a movement detecting function. The number of required light sources is and the power consumption is low. The cost can be reduced and the life time can be extended thereby.

For achieving the objects described above, the present invention provides a contact image sensing module with a movement detecting function, including a main circuit substrate, a linear sensor array, at least a movement detecting element, a light source, and a detecting surface. The linear sensor array is mounted on the main circuit substrate. At least a movement detecting element is mounted on the main circuit substrate and is parallel-arranged at one side of the linear sensor array. A light source and the detecting surface is defined at one side of the linear sensor array and the movement detecting element. The detecting surface is used for placement of a sensed object thereon. A light from the light source is transmitted to the detecting surface and then the light is reflected by the sensed object to the linear sensor and the movement detecting element.

In the preferred embodiment, the linear sensor array has plural image sensors. At least one of the image sensors corresponds to the at least a movement detecting element and is defined as at least a comparison sensor.

By drawing out a section of reference image data and a section of comparison image data, respectively, by the movement detecting element and the comparison sensor from the sensed object and after processing an equation for deciding the number of shifting and a speed deciding equation, the relative moving speed of the sensed object relating to the movement detecting element and the comparison sensor can be obtained. The structure of the light-guiding device makes the light transmitted from the light source to the sensed object more uniform. Therefore, the volume of image sensing module according to the present invention can be reduced.

In the preferred embodiment, the main circuit substrate is a flex-rigid composite substrate comprising a first rigid circuit substrate, a second rigid circuit substrate, a third rigid circuit substrate, and at least a flex circuit board. The first rigid circuit substrate, the second rigid circuit substrate and the third rigid circuit substrate are electrically connected to the flex circuit board to form, respectively, a first composite substrate, a second composite substrate and a third composite substrate. The second composite substrate and the third composite substrate are respectively tilted upward by a predetermined angle relating to the first composite substrate. The linear sensor array and the movement detecting element are mounted on the second composite substrate. The light source is mounted on the third composite substrate.

In the preferred embodiment, the main circuit substrate is a flex-rigid composite substrate includes a first rigid circuit substrate, a second rigid circuit substrate, and at least a flex circuit board. The first rigid circuit substrate and the second rigid circuit substrate are electrically connected to the flex circuit board for respectively forming a first composite substrate and a second composite substrate. The second composite substrate is tilted upward by a predetermined angle relating to the first composite substrate. The linear sensor array and the movement detecting element are mounted on the second composite substrate. The light source is mounted on the third composite substrate.

Through the structure of the flex-rigid composite substrate, the linear sensor array may form a tilted angle such that the whole volume can be reduced and the allowed tolerance for the light path of the light source can be increased.

In the preferred embodiment, a light-guiding device is further included. The light-guiding device is axially parallel to the linear sensor array and has one end adjacent to light source.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DETAILED DESCRIPTION OF PREFERRED EMBODIMENTS

Figure 1:
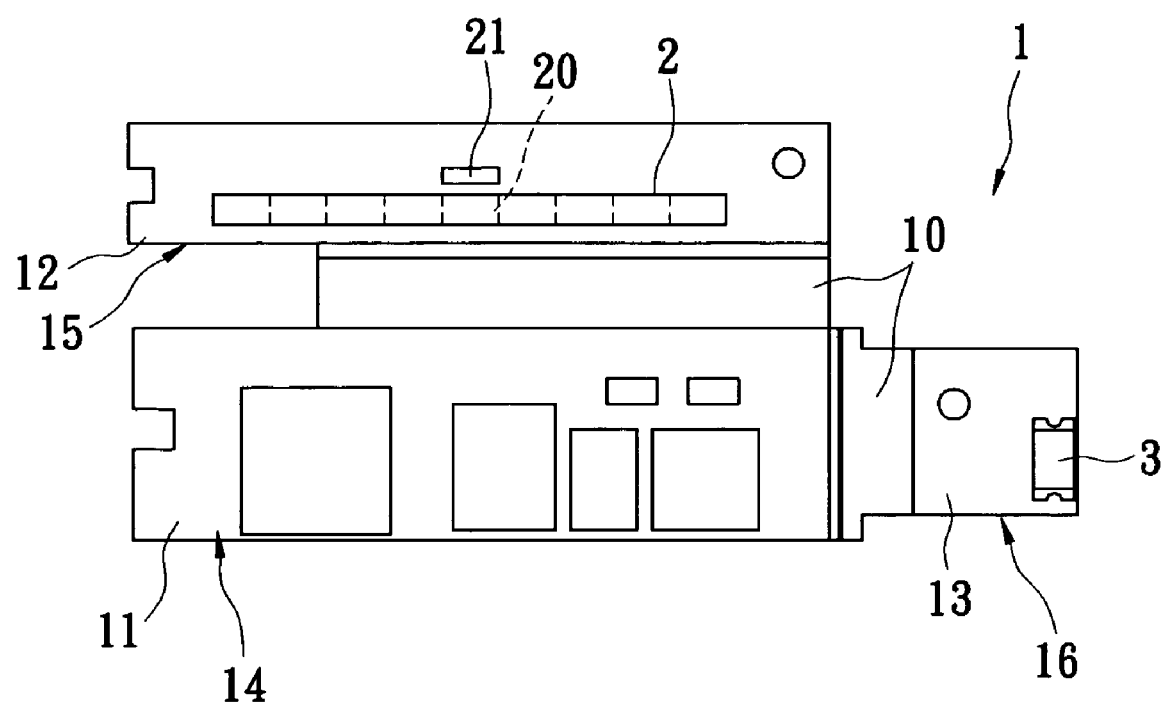
FIG. 1 is a vertical view showing a flex-rigid composite substrate, a linear sensor array, a movement detecting element and a light source in a first embodiment of a contact image sensing module with a movement detecting function according to the present invention.

References are made to FIGS. 1 to 7 showing a first embodiment of the present invention. The present invention is a contact image sensing module with a movement detecting function including a main circuit substrate 1, a linear sensor array 2, at least a movement detecting element 2, a light source 3, a focusing device 4, a light-guiding device 5, and a detecting surface A.

The main circuit substrate 1 is a flex-rigid composite substrate including a first rigid circuit substrate 11, a second rigid circuit substrate 12, a third rigid circuit substrate 13, and at least a flex circuit board 10. The first rigid circuit substrate 11, the second rigid circuit substrate 12 and the third rigid circuit substrate 13 are electrically connected to the flex circuit board 10 and are respectively stacked with and adhered to the flex circuit board 10 so as to form a first composite substrate 14, a second composite substrate 15 and a third composite substrate 16. Further, the flex circuit board 10 for connecting the first composite substrate 14 with the second composite substrate 15 can be identical to or different from the flex circuit board 10 for connecting the first composite substrate 14 with the third composite substrate 16.

Figure 2:
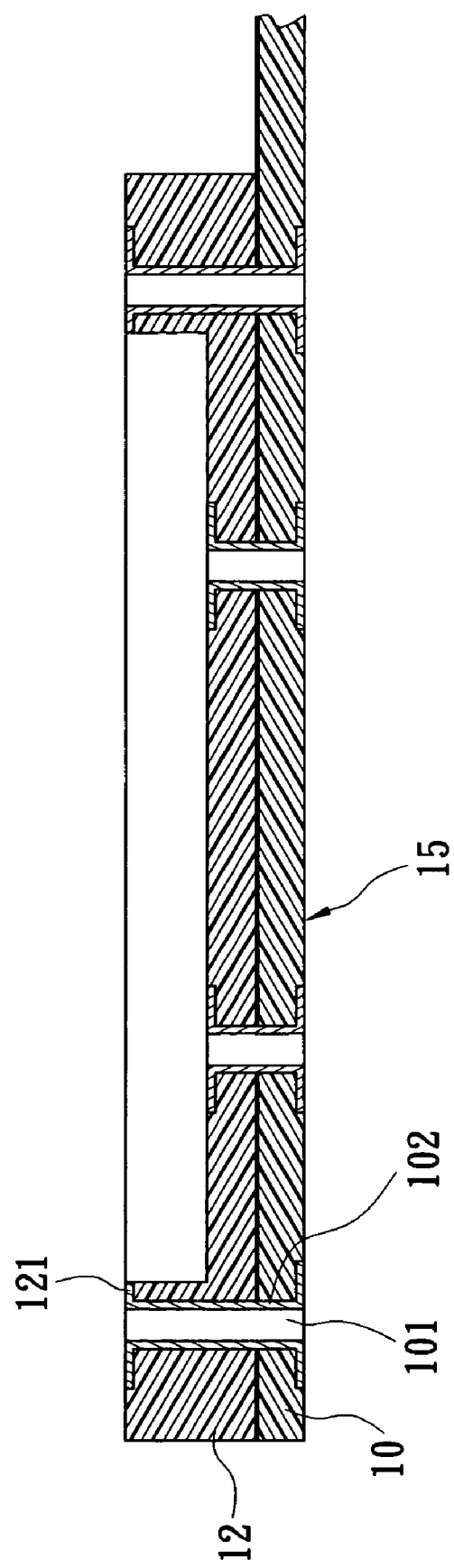
FIG. 2 is a partial, cross-sectional drawing showing the flex-rigid composite substrate in a first embodiment of a contact image sensing module with a movement detecting function according to the present invention.
Figure 3:
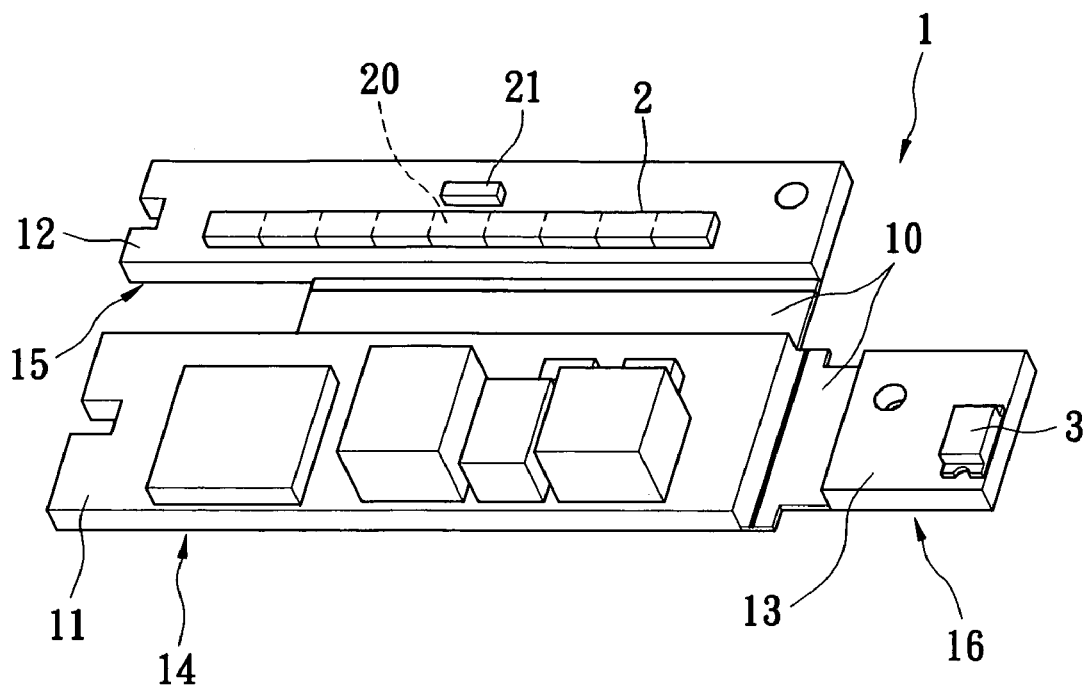
FIG. 3 is a three-dimensional schematic view showing a flex-rigid composite substrate, a linear sensor array, a movement detecting element and a light source in a first embodiment of a contact image sensing module with a movement detecting function according to the present invention.
Figure 4:
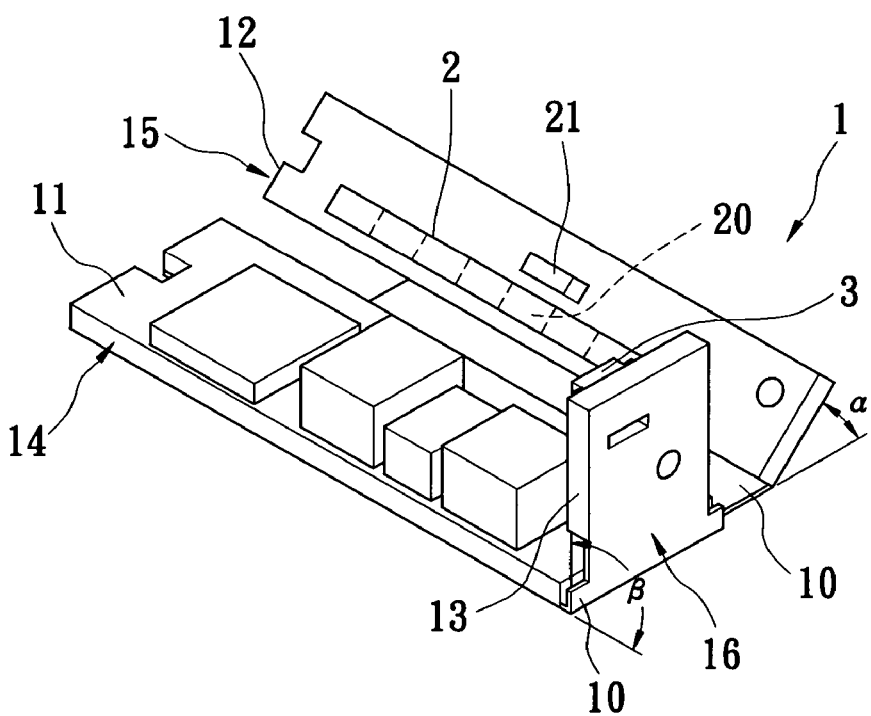
FIG. 4 is another three-dimensional schematic view showing a flex-rigid composite substrate, a linear sensor array, a movement detecting element and a light source in a first embodiment of a contact image sensing module with a movement detecting function according to the present invention.
Figure 5:
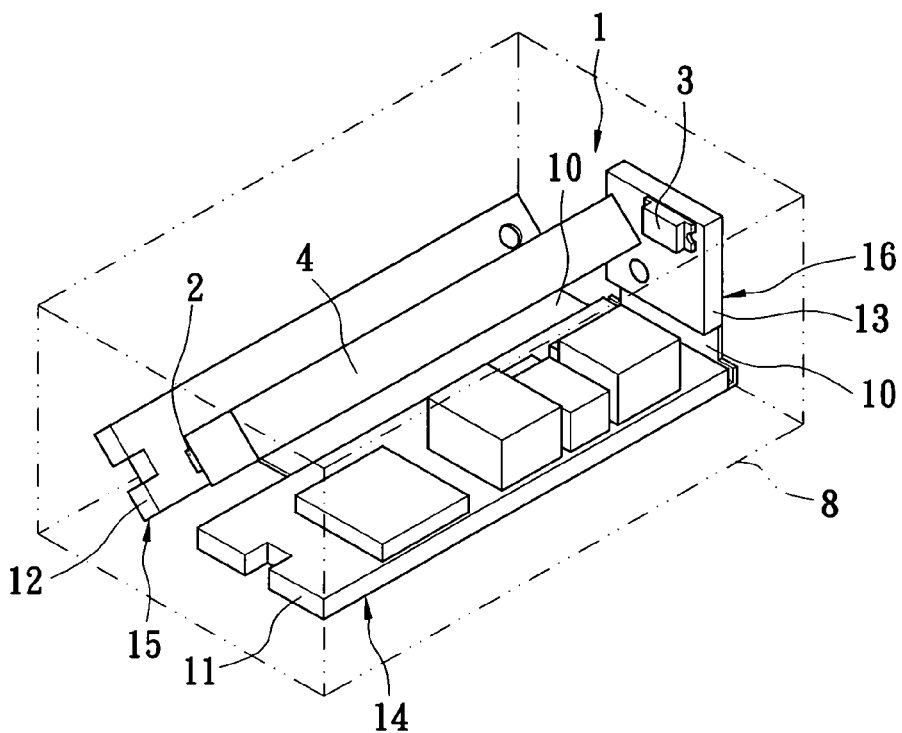
FIG. 5 is a three-dimensional schematic view showing a flex-rigid composite substrate, a linear sensor array, a movement detecting element, a light source and a focusing device in a first embodiment of a contact image sensing module with a movement detecting function according to the present invention.
Figure 6:
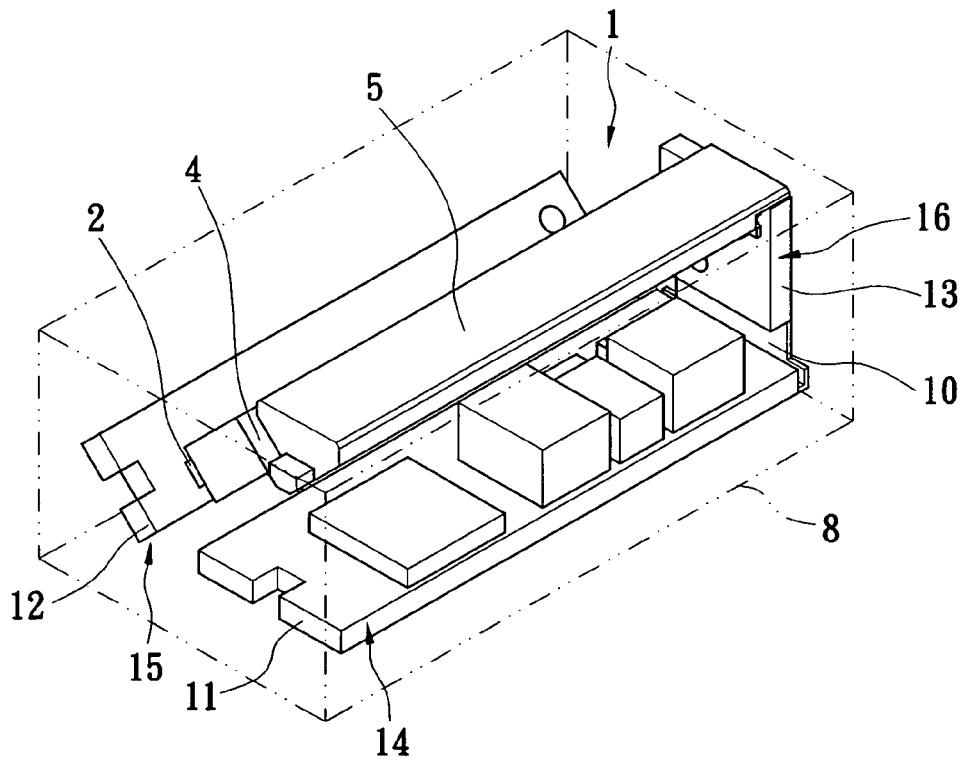
FIG. 6 is a three-dimensional schematic view showing the first embodiment of a contact image sensing module with a movement detecting function according to the present invention.

FIG. 2 shows an embodiment of the flex-rigid composite substrate. The first composite substrate (not shown), the second composite substrate 15, and the third composite substrate (not shown) respectively have plural through holes 101 and plural conducting elements 102 mounted therein. Each conducting element 102 is mounted on the inner surface of each corresponding through hole 101 and is electrically connected to the first rigid circuit substrate and the flex circuit board 10, the second rigid circuit substrate and the flex circuit board 10, and the third rigid circuit substrate and the flex circuit board 10. Further, the second rigid circuit substrate 12 of the second composite substrate 15 has plural welding pads 121 mounted thereon. The welding pads 121 are electrically connected to partially corresponding conducting element 102, respectively.

The second composite substrate 15 and the third composite substrate 16 are respectively tilted upward by a predetermined angle $\alpha$, $\beta$. In this embodiment, the second composite substrate 15 is upward tilted by 45° relative to the first composite substrate 14, and the third composite substrate 16 is upward tilted by 90° relative to the first composite substrate 14. However, these predetermined angles $\alpha$ and $\beta$ can be various angles such as 30°, 60° or 75°.

The linear sensor array 2 is used to draw fragmentally plural fragments of the image of the sensed object 9. The linear sensor array 2 is mounted on the second composite substrate of the main circuit substrate 1. The linear sensor array 2 has plural contact image sensors (CIS). The linear sensor array 2 is electrically connected to the second rigid circuit substrate 12 of the second composite substrate 15 and the welding pads 121 in a COB (chip-on-board) manner and is electrically connected to the first rigid circuit substrate 11 of the first composite substrate 14 through the flex circuit board 10.

The movement detecting element 21 is mounted on the second composite substrate 15 of the main circuit substrate 1 and is parallel-arranged at one side of the linear sensor array 2. The movement detecting element 21 is a contact image sensor. The movement detecting element 21 is electrically connected to the second rigid circuit substrate 12 in a COB manner and is electrically connected to the first rigid circuit substrate 11 of the first composite substrate 14 through the flex circuit board 10.

At least one of the image sensors corresponds to the movement detecting element 21 and is defined as at least a comparison sensor 20.

The light source 3, such as a light-emitting diode, is mounted on the third composite substrate 16 of the main circuit substrate 1. The light source 3 is electrically connected to the third rigid circuit substrate 13 of the third composite substrate 16 in a COB manner and is electrically connected to the first rigid circuit substrate 11 of the first composite substrate 14 through the flex circuit board 10. The light source 3 also can be mounted on other circuit substrate.

The focusing device 4, such as a lens, is axially parallel to the linear sensor array 2.

The light-guiding device 5, such as a transparent shaft, is axially parallel to the linear sensor array 2. One end of the light-guiding device 5 is adjacent to the light source 3 and the focusing device 4 is located between the light-guiding device 5 and the linear sensor array 2. The light-guiding device 5 has a reflection surface 50 and, a light-output surface 51, which are formed along the axial direction and the light-output surface 51, corresponding to the focusing device 4. The focusing device 4 and the light-guiding device 5 are supported on the machine 8 of an electronic apparatus. The focusing device 4 also can be connected with or assembled to the light-guiding device 5.

Figure 7:
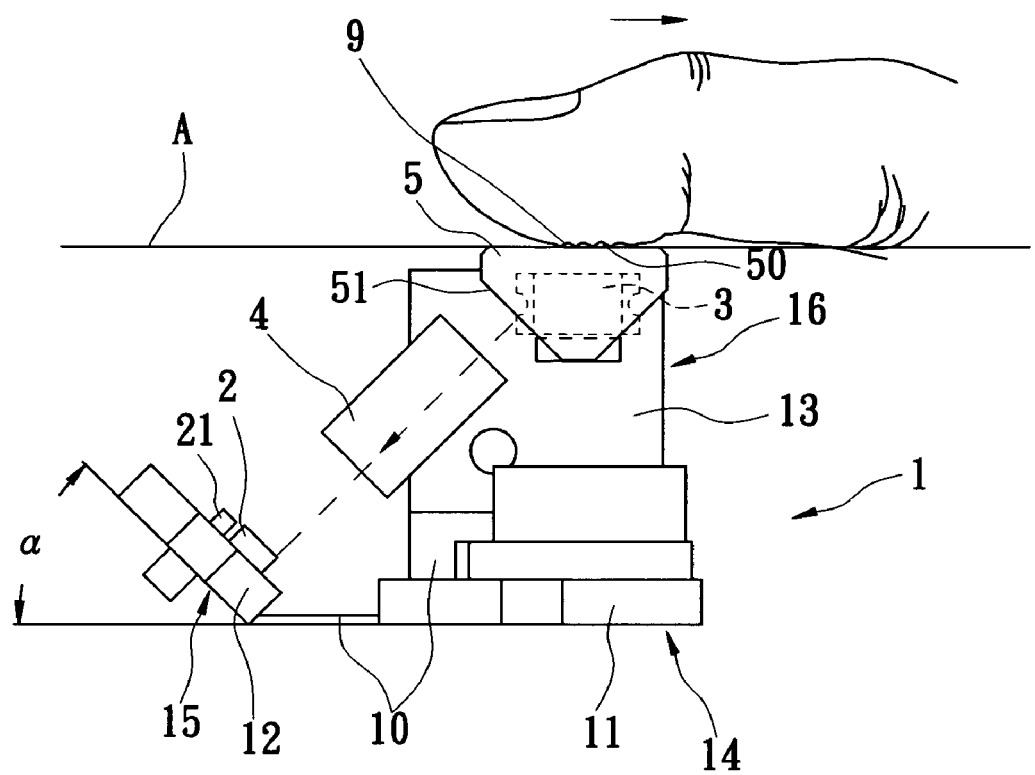
FIG. 7 is a cross-sectional view showing the first embodiment of a contact image sensing module with a movement detecting function according to the present invention.
Figure 8:
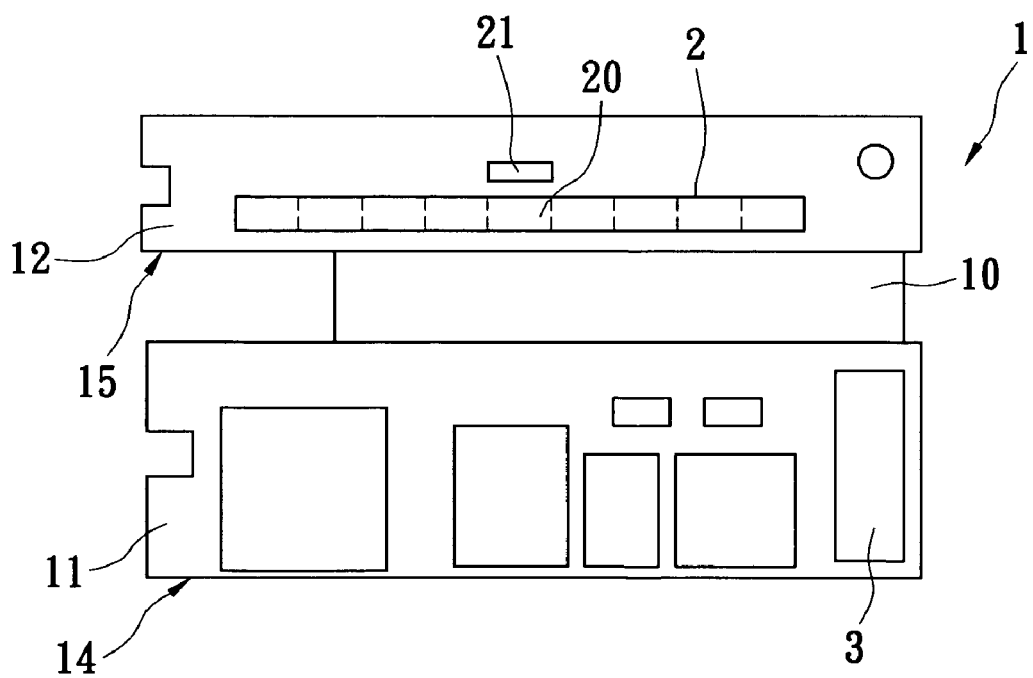
FIG. 8 is a vertical view showing a flex-rigid composite substrate, a linear sensor array, a movement detecting element and a light source in a second embodiment of a contact image sensing module with a movement detecting function according to the present invention.
Figure 9:
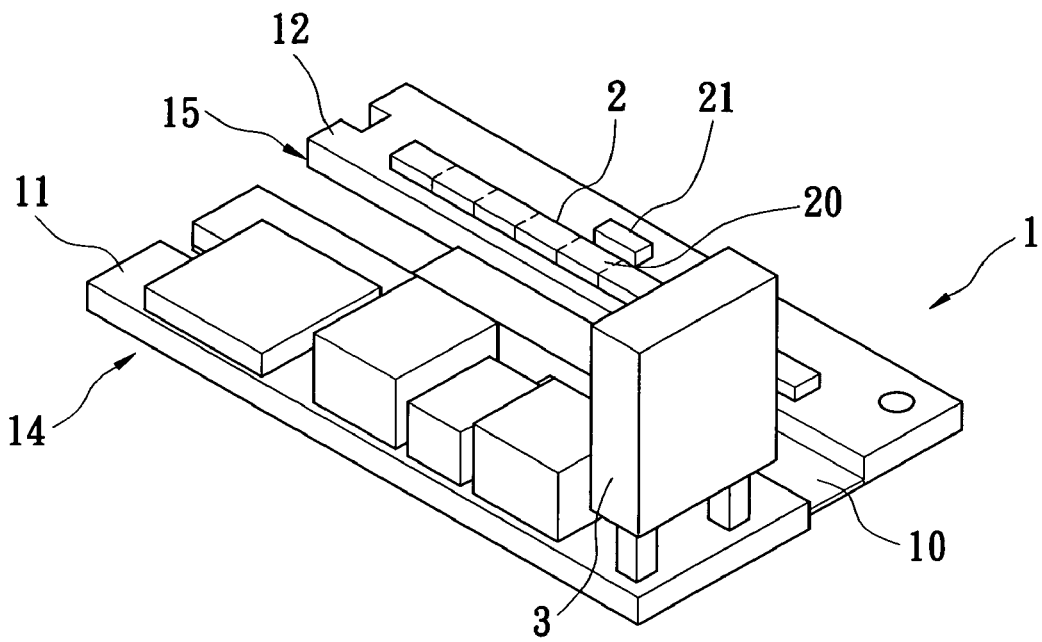
FIG. 9 is a three-dimensional schematic view showing a flex-rigid composite substrate, a linear sensor array, a movement detecting element and a light source in a second embodiment of a contact image sensing module with a movement detecting function according to the present invention.
Figure 10:
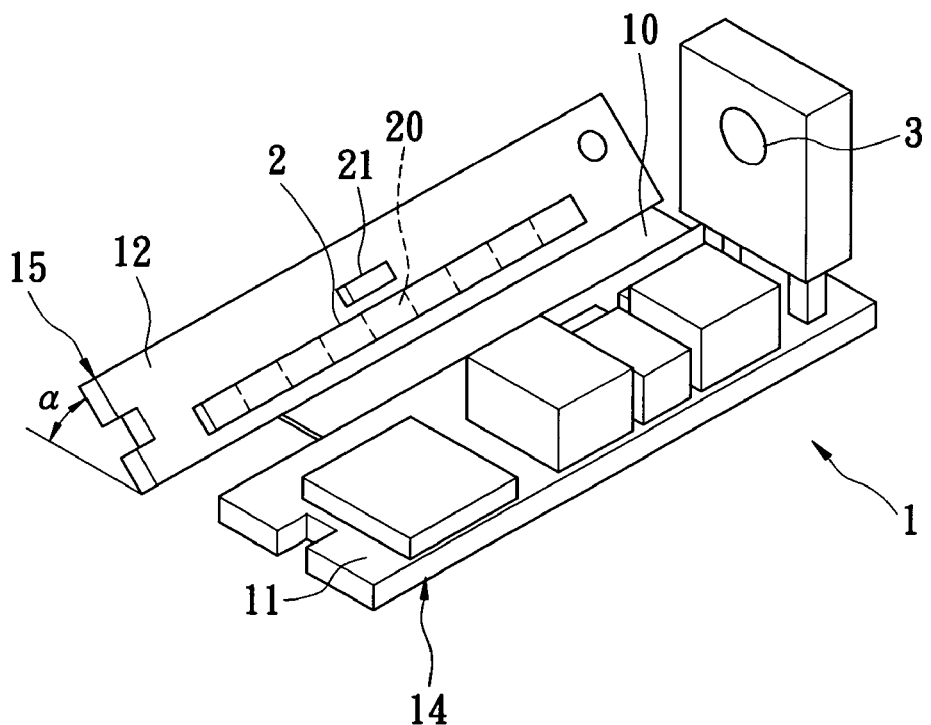
FIG. 10 is another three-dimensional schematic view showing a flex-rigid composite substrate, a linear sensor array, a movement detecting element and a light source in a second embodiment of a contact image sensing module with a movement detecting function according to the present invention.
Figure 11:
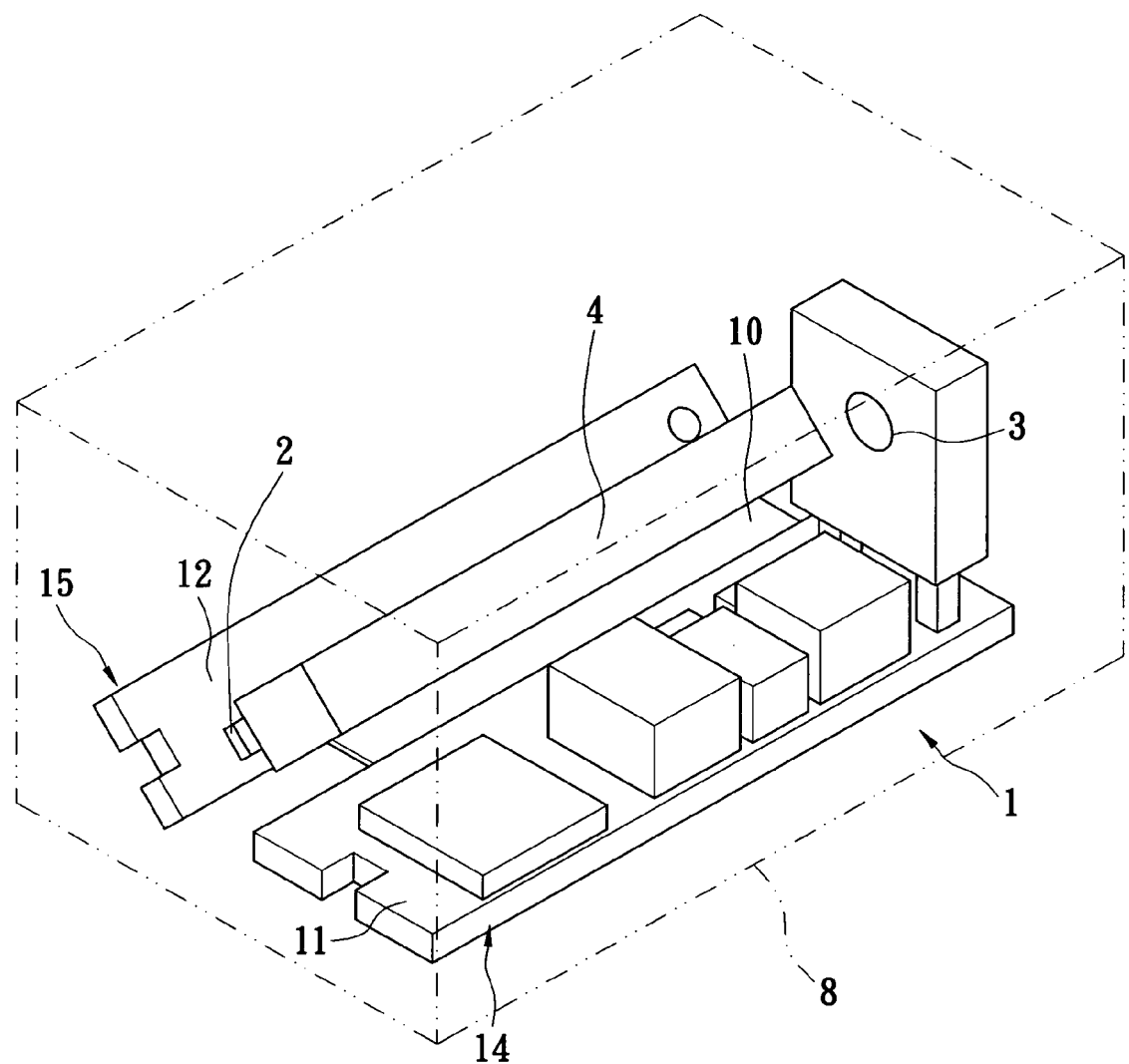
FIG. 11 is a three-dimensional schematic view showing a flex-rigid composite substrate, a linear sensor array, a movement detecting element, a light source and a focusing device in a second embodiment of a contact image sensing module with a movement detecting function according to the present invention.
Figure 12:
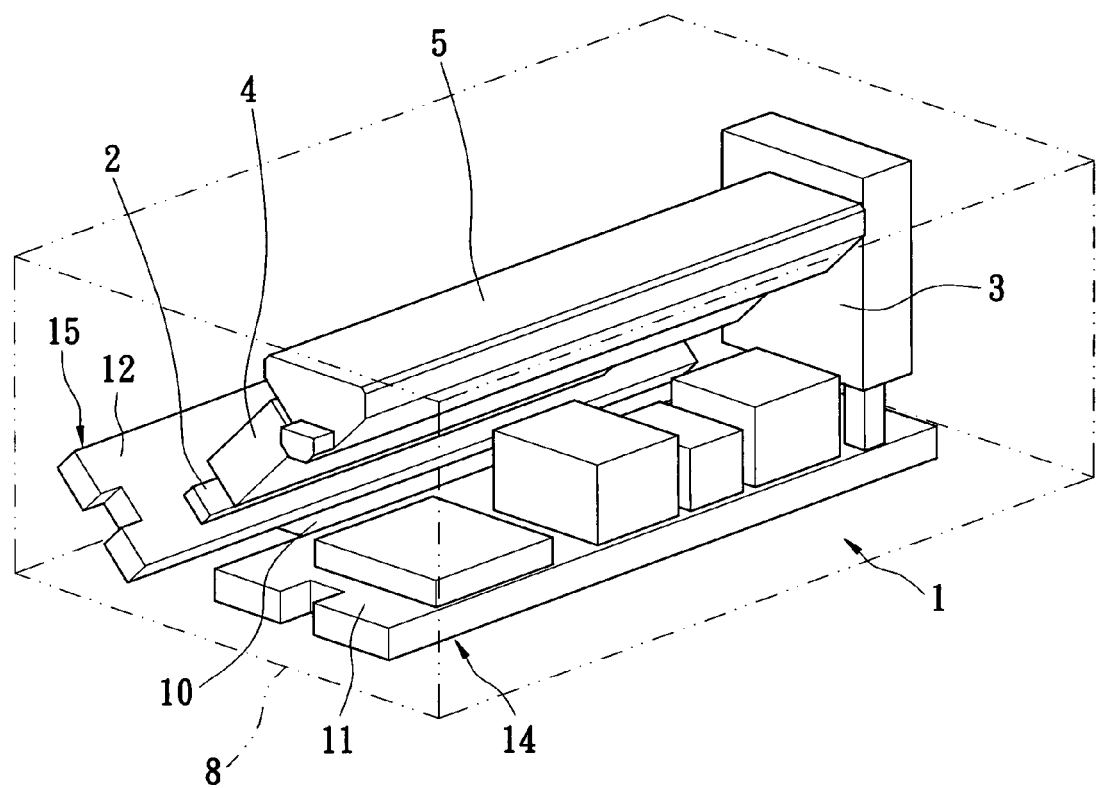
FIG. 12 is a cross-sectional view showing the second embodiment of a contact image sensing module with a movement detecting function according to the present invention.

The detecting surface A is defined at one side of the linear sensor array 2 and the movement detecting element 21. As shown in FIG. 7, the detecting surface A is defined at the reflection surface 50 for positioning a sensed object 9 (for example, a fingerprint) thereon.

As shown in FIG. 7, the sensed object 9 is moved on the detecting surface A along a longitudinal direction of the image sensing module according to the present invention. That is to say, it is moved on the reflection surface 50 along a longitudinal direction, which is perpendicular to the linear sensor array 2. The light of the light source 3 is projected to one end of the light-guiding device 5 and the light-guiding device 5 will uniformly guide the light therein. Then, the light is transmitted to the detecting surface A and the light will be reflected by the sensed object 9, passing through the light-output surface 51 and to the focusing device 4. Therefore, the light is focused on the linear sensor array 2 and the movement detecting element 21 by the focusing device and a further operation is performed for integrating fragmental images of the sensed object 9 into a complete image so as to complete image recognition.

When the sensed object 9 is moving on the detecting surface A, the movement detecting element 21 and the comparison sensor 20 of the linear sensor array 2 can, respectively, draw out a reference image data and a comparison image data of a space domain repeatedly in accordance with the time sequence of sampling. A section of the reference image data and a section of the comparison image data, respectively, are then selected for performing the operation of an equation for deciding the number of shift and of a speed deciding equation. The relative moving speed of the sensed object 9 relating to the movement detecting element 21 and the comparison sensor 20 are thereby obtained without employing the conventional complex structure. Therefore, the volume of the image sensing module according to the present invention can be reduced and the space occupied by the assembled electronic apparatus also can be saved. In addition, through the equation for deciding the number of shifting and of the speed deciding equation, the influences caused by the environment, the electrical noises, or the characteristic difference between each sensor on the original image data can be avoided. The detected relative moving speed can thus be more accurate.

Because the flex circuit board 10 of the flex-rigid composite substrate can be bent to form a tilted angle of the linear sensor array 2, the length and longitudinal depth of the image sensing module according to the present invention therefore can be shortened such that the whole volume can be reduced for facilitating assembly thereof in a microminiaturized electronic apparatus. In addition, since the allowed tolerance for the light path of the light source 3 is increased, the product yield can be improved. Furthermore, cooperating the short distance between the movement detecting element 21 and the linear sensor array 2 with the upward-tilt adjustment of the first composite substrate 14, the image distortion can be avoided.

The light-guiding function of the light-guiding device 5 allows the required number of light sources 3 in the image sensing module according to the present invention to be few and also makes the light of the light source 3 more uniform. Therefore, both the cost and the power consumption can be reduced and the operation efficiency of the image sensing module according to the present invention for the drawn images of the sensed object can be improved.

References are made to FIGS. 8 to 12 showing a second embodiment according to the present invention. The difference between the second embodiment and the first embodiment is the main circuit substrate 1 and the light source 3. In this embodiment, the main circuit substrate 1 is a flex-rigid composite substrate including a first rigid circuit substrate 11, a second rigid circuit substrate 12, and at least a flex circuit board 10. The first rigid circuit substrate 11 and the second rigid circuit substrate 12 are electrically connected to the flex circuit board 10 and are respectively stacked with and adhered to the flex circuit board 10 to form a first composite substrate 14 and a second composite substrate 15. The second composite substrate 15 has an upward tilted angle α relating to the first composite 14. Furthermore, the light source 3 is electrically connected to the first rigid circuit substrate 11 of the first composite substrate 14 in a DIP (Dual-In-Line-Package) manner, and thus, the light source 3 of this embodiment is directly mounted on the first composite substrate 14. The effect of the first embodiment also can be achieved in this manner.

However, the main circuit substrate 1 also can be a traditional rigid circuit substrate, and the relative moving speed can be obtained through the equation for deciding the number of shifting and the speed deciding equation.

Consequently, the contact image sensing module with a movement detecting function according to the present invention is characterized in that:

1. The movement detecting element and the comparison sensor of the linear sensor array can, respectively, draw out a section of reference image data and a section of comparison image data of a space domain repeatedly for performing the operation of an equation for deciding the number of shift and of a speed deciding equation so as to obtain the relative moving speed of the sensed object relating to the movement detecting element and the comparison sensor. Therefore, the volume of the image sensing module according to the present invention can be reduced and the space occupied by the assembled electronic apparatus also can be saved.

2. The flex-rigid composite substrate structure makes the linear sensor array to form a tilted angle such that the whole volume can be reduced for facilitating an assembling of the image sensing module according to the present invention to the microminiaturized electronic apparatus.

3. The flex-rigid composite substrate structure makes the linear sensor array to form a tilted angle such that the allowed tolerance for the light path of the light source can be increased and the product yield can be improved.

4. The structure of the light-guiding device makes the light transmitted from the light source to the sensed object to be more uniform so that the operation efficiency of the image sensing module according to the present invention for the drawn images of the sensed object can be improved.

5. The structure of the light-guiding device can reduce the required amount of the light source and the power consumption so that the cost of the image sensing module according to the present invention can be reduced and the life time can be extended.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A contact image sensing module with a movement detecting function, comprising:
   a main circuit substrate being a flex-rigid composite substrate, the main circuit substrate comprising a first rigid circuit substrate, a second rigid circuit substrate, a third rigid circuit substrate, and at least a flex circuit board, wherein the first rigid circuit substrate, the second rigid circuit substrate and the third rigid circuit substrate are electrically connected to the at least a flex circuit board so as to form, respectively, a first composite substrate, a second composite substrate and a third composite substrate, the second composite substrate and the third composite substrate respectively tilted upward by a predetermined angle relating to the first composite substrate;
   a linear sensor array mounted on the second composite substrate;
   at least a movement detecting element mounted on the second composite substrate and parallel-arranged at one side of the linear sensor array;
   a light source mounted on the third composite substrate; and
   a detecting surface defined at one side of the linear sensor array and the at least a movement detecting element, wherein the detecting surface is used for placement of a sensed object thereon, a light from the light source is transmitted to the detecting surface, and the light is then reflected by the sensed object to the linear sensor array and the at least a movement detecting element.

2. The sensing module according to claim 1, wherein the first composite substrate, the second composite substrate, and the third composite substrate respectively have plural through holes and plural conducting elements mounted therein, wherein each conducting element is mounted on an inner surface of each corresponding through hole and is electrically connected to the first rigid circuit substrate and the at least a flex circuit board, the second rigid circuit substrate and the at least a flex circuit board, and the third rigid circuit substrate and the at least a flex circuit board.

3. The sensing module according to claim 1, wherein the second composite substrate is upwardly tilted by 45° relative to the first composite substrate.

4. The sensing module according to claim 1, wherein the third composite substrate is upwardly tilted through 90 relative to the first composite substrate.

5. The sensing module according to claim 1, wherein the linear sensor array and the at least a movement detecting element are electrically connected to the second rigid circuit substrate in a COB (chip-on-board) manner.

6. The sensing module according to claim 1, wherein the light source is electrically connected to the third rigid circuit substrate in a COB manner.

7. A contact image sensing module with a movement detecting function, comprising:
   a main circuit substrate being a flex-rigid composite substrate, the main circuit substrate comprising a first rigid circuit substrate, a second rigid circuit substrate, and at least a flex circuit board, wherein the first rigid circuit substrate and the second rigid circuit substrate are electrically connected to the at least a flex circuit board so as to form, respectively, a first composite substrate and a second composite substrate, the second composite substrate tilted upward by a predetermined angle relating to the first composite substrate,;
   a linear sensor array mounted on the second composite substrate;
   at least a movement detecting element mounted on the second composite substrate and parallel-arranged at one side of the linear sensor array;
   a light source mounted on the first composite substrate; and
   a detecting surface defined at one side of the linear sensor array and the at least a movement detecting element, wherein the detecting surface is used for placement of a sensed object thereon, a light from the light source is transmitted to the detecting surface, and the light is then reflected by the sensed object to the linear sensor array and the at least a movement detecting element.

8. The sensing module according to claim 7, wherein the first composite substrate and the second composite substrate respectively have plural through holes and plural conducting elements mounted thereon, wherein each conducting element is mounted on an inner surface of each corresponding through hole and is electrically connected to the first rigid circuit substrate and the at least a flex circuit board, and the second rigid circuit substrate and the at least a flex circuit board.

9. The sensing module according to claim 7, wherein the second composite substrate is upward tilted by 45 relating to the first composite substrate.

10. The sensing module according to claim 7, wherein the linear sensor array and the at least a movement detecting element are electrically connected to the second rigid circuit substrate in a COB (chip-on-board) manner.

11. The sensing module according to claim 7, wherein the light source is electrically connected to the first rigid circuit substrate in a DIP (Dual-In-Line-Package) manner.

12. The sensing module according to claim 1, wherein the linear sensor array has plural contact image sensors, and at least one of the image sensing elements is corresponded to the at least a movement detecting element and is defined as at least a comparison sensing element.

13. The sensing module according to claim 7, wherein the linear sensor array has plural contact image sensors, and the at least a movement detecting element is a contact image sensor.

14. The sensing module according to claim 7, wherein the light source is a light-emitting diode.

15. The sensing module according to claim 7, further comprising a light-guiding device, wherein the light-guiding device is axially parallel to the linear sensor array, and an end of the light-guiding device is adjacent to the light source.

16. The sensing module according to claim 15, further comprising a focusing device axially parallel to the linear sensing sensor array and located between the light-guiding device and the linear sensor array.

17. The sensing module according to claim 16, wherein the focusing device is a lens.

18. The sensing module according to claim 16, wherein the light-guiding device has a reflection surface and a light-output surface formed along an axial direction thereof, wherein detection is defined at the reflecting surface and the light-output surface corresponds to the focusing device.

* * * * *